United States Patent
Cao et al.

(10) Patent No.: US 12,325,844 B2
(45) Date of Patent: Jun. 10, 2025

(54) PHOTORESIST REMOVER

(71) Applicant: Versum Materials US, LLC, Tempe, AZ (US)

(72) Inventors: Yuanmei Cao, Carmel, IN (US); Michael Phenis, Markleville, IN (US); Lili Wang, Chandler, AZ (US); Laisheng Sun, Gilbert, AZ (US); Aiping Wu, Chandler, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 533 days.

(21) Appl. No.: 17/753,529

(22) PCT Filed: Sep. 28, 2020

(86) PCT No.: PCT/US2020/052991
§ 371 (c)(1),
(2) Date: Mar. 7, 2022

(87) PCT Pub. No.: WO2021/067147
PCT Pub. Date: Apr. 8, 2021

(65) Prior Publication Data
US 2022/0333044 A1    Oct. 20, 2022

Related U.S. Application Data

(60) Provisional application No. 62/908,566, filed on Sep. 30, 2019.

(51) Int. Cl.
| | |
|---|---|
| *C11D 3/30* | (2006.01) |
| *C11D 3/20* | (2006.01) |
| *C11D 3/28* | (2006.01) |
| *C11D 3/33* | (2006.01) |
| *C11D 3/34* | (2006.01) |
| *C11D 3/43* | (2006.01) |
| *C11D 7/10* | (2006.01) |
| *C11D 7/32* | (2006.01) |
| *C11D 7/50* | (2006.01) |
| *G03F 7/42* | (2006.01) |

(52) U.S. Cl.
CPC .......... *C11D 7/3218* (2013.01); *C11D 3/2068* (2013.01); *C11D 3/2079* (2013.01); *C11D 3/2082* (2013.01); *C11D 3/28* (2013.01); *C11D 3/30* (2013.01); *C11D 3/33* (2013.01); *C11D 3/3445* (2013.01); *C11D 3/43* (2013.01); *C11D 7/105* (2013.01); *C11D 7/5022* (2013.01); *G03F 7/425* (2013.01)

(58) Field of Classification Search
CPC ... C11D 3/2068; C11D 3/2082; C11D 3/2079; C11D 3/28; C11D 3/30; C11D 3/33; C11D 3/3445; C11D 3/43

USPC ....... 510/175, 176, 477, 488, 499, 500, 505, 510/506
See application file for complete search history.

(56) References Cited

U.S. PATENT DOCUMENTS

| | | |
|---|---|---|
| 10,133,180 B2 | 11/2018 | Hsu |
| 2001/0034313 A1 | 10/2001 | Honda et al. |
| 2004/0048761 A1 | 3/2004 | IKemoto |
| 2005/0048397 A1 | 3/2005 | Jo et al. |
| 2010/0152086 A1 | 6/2010 | Wu et al. |
| 2014/0100151 A1 | 4/2014 | Egbe et al. |
| 2015/0040796 A1 | 2/2015 | Hughes et al. |
| 2016/0179011 A1 | 6/2016 | Agarwal et al. |
| 2016/0186058 A1 | 6/2016 | Parris et al. |
| 2017/0017161 A1 | 1/2017 | Lee et al. |
| 2017/0145311 A1 * | 5/2017 | Liu ................... H01L 21/30608 |
| 2018/0105702 A1 | 4/2018 | Mardel et al. |
| 2018/0143531 A1 | 5/2018 | Mukai |
| 2019/0278184 A1 | 9/2019 | Cao et al. |

FOREIGN PATENT DOCUMENTS

| | | | |
|---|---|---|---|
| CN | 101286016 A | 10/2008 | |
| CN | 102338994 A | 2/2012 | |
| CN | 105824201 A | 8/2016 | |
| EP | 2290046 A | 2/2011 | |
| EP | 3502225 A1 * | 6/2019 | ............... B32B 3/06 |
| EP | 3537474 A1 | 9/2019 | |
| EP | 3553811 A1 | 10/2019 | |
| SG | 10201903002 | 11/2019 | |
| TW | 200951647 A | 12/2009 | |
| WO | 2013052809 A | 11/2013 | |
| WO | 2015019277 A1 | 3/2015 | |
| WO | 2017023677 A | 2/2017 | |

OTHER PUBLICATIONS

Intellectual Property Office of Singapore; Patent Search Report; Application No. 11202202611S; Apr. 8, 2024.
Search Report; ROC (Taiwan) Patent Application No. 109133599; Feb. 27, 2024.
The China National Intellectual Property Administration; Patent Search Report; Application No. 2020800686452; Jan. 9, 2024.
Supplementary European Search Report; Application No. EP 20 87 2611; Munich, Sep. 20, 2023.
Written Opinion of the International Searching Authority; PCT/US2020/052991; Jan. 14, 2021.

\* cited by examiner

*Primary Examiner* — Gregory R Delcotto
(74) *Attorney, Agent, or Firm* — William T. Slaven, IV; Versum Materials US, LLC

(57) ABSTRACT

Cleaning compositions and the method of using the same are disclosed, where the compositions include one or more alkanolamines, one or more ether alcohol solvents or aromatic containing alcohol, one or more corrosion inhibitors, and optionally one or more secondary solvents.

18 Claims, No Drawings

PHOTORESIST REMOVER

This application is a national stage application, filed under 35 U.S.C. § 371, of International Patent Application No. PCT/US2020/052991 (filed on 28 Sep. 2020) which claims the benefit of U.S. Provisional Patent Application No. 62/908,566 (filed on 30 Sep. 2019) each of which applications is incorporated herein by reference in their entirety.

BACKGROUND

The disclosed and claimed subject matter relates generally to compositions having the ability to effectively remove photoresists from substrates, and to methods for using such compositions.

There are many stripper solutions for the removal of photoresists, such as those disclosed in US2001034313 AA and US20180143531A1. Improved stripper solution compositions are required by wafer manufacturers' increasing demands for improved performance. With various materials used in the substrates for various functions, strippers may contact those materials and thus there is a need to have the ability to remove the stripper and compatibility with materials on the substrate that are not to be removed. Additionally, with recent restrictions on solvents used in stripper formulations, such as the restrictions on N-methyl-2-pyrrolidone (NMP) and dimethyl sulfoxide (DMSO), new formulations with more environmentally friendly solvent are need.

SUMMARY

In one aspect of the disclosed and claimed subject matter there are provided photoresist stripper solutions for effectively removing or stripping a photoresist from a substrate. The inventive stripper solutions are free or substantially free of NMP and DMSO and are particularly useful for removing positive photoresists and not harm the materials present on the substrates particularly passivation layers, for examples, polyimide (PI) and polybenzoxazole (PBO) passivation layers.

The compositions according to the disclosed and claimed subject matter include (i) one or more organic solvents, (ii) one or more alkanolamines and/or amines and (iii) one or more corrosion inhibitors. In a further aspect, the compositions include (iv) one or more secondary solvent(s). In a further aspect of this embodiment, the disclosed and claimed chemical formulations consist essentially of (i), (ii) and (iii). In a further aspect of this embodiment, the disclosed and claimed chemical formulations consist essentially of (i), (ii), (iii) and (iv). In yet a further aspect of this embodiment, the disclosed and claimed chemical formulations consist of (i), (ii) and (iii). In yet a further aspect of this embodiment, the disclosed and claimed chemical formulations consist of (i), (ii), (iii) and (iv).

In a further aspect, the one or more corrosion inhibitors includes two or more corrosion inhibitors. Some embodiments are free or substantially free of water and/or are free or substantially free of strong bases (e.g., KOH, quaternary ammonium hydroxides).

In another embodiment, the composition includes (i) one or more alkanolamines, (ii) one or more ether alcohol solvents or aromatic ring-containing alcohol and (iii) one or more corrosion inhibitors. A further embodiment according to this disclosure could contain an additional or secondary solvent. Preferred secondary solvents include aliphatic alcohols. A further embodiment, according to this present disclosure could contain amines or a combination of amines and alkanolamines. A further embodiment, according to this present disclosure, additionally contains two corrosion inhibitors.

A second aspect of the present disclosure provides for methods of using the stripper solutions described above to remove photoresist from a substrate. A photoresist can be removed from a selected substrate having a photoresist thereon by contacting the substrate with a stripping solution for a time sufficient to remove the desired amount of photoresist, by removing the substrate from the stripping solution, rinsing the stripping solution from the substrate with a solvent and drying the substrate.

In one embodiment, the stripper includes from about 20% to about 90% diethylene glycol monobutyl ether, from about 0.01% to about 5% of one or more corrosion inhibitors, and from about 5% to about 40% of one or more alkanolamines having at least two carbon atoms, at least one amino substituent and at least one hydroxyl substituent, the amino and hydroxyl substituents attached to two different carbon atoms.

In a further aspect, the alkanolamines are 1,2-alkanolamines of the formula:

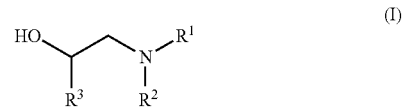

wherein each of $R^1$, $R^2$ and $R^3$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino. In some embodiments, each of $R^1$ and $R^2$ is independently selected from H, $C_1$-$C_4$ alkyl, or $C_1$-$C_4$ alkylamino. In one embodiment, $R^1$ is —H or —$CH_2CH_2NH_2$ and $R^2$ is H. In another embodiment, $R^1$ is —$CH_2CH_2NH_2$ and $R^2$ is —H. In another embodiment, both $R^1$ and $R^2$ are —H. In another embodiment, both $R^1$ and $R^2$ are —$CH_2CH_2OH$. In another aspect of this embodiment, $R^3$ is —$CH_3$.

In one embodiment, the formulation includes the alkanolamine of formula (I) where one or both of $R^1$ and $R^2$ is H.

In one embodiment, the formulation includes the alkanolamine of formula (I) where each of $R^1$, $R^2$ and $R^3$ is H:

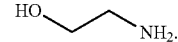

In one embodiment, the formulation includes the alkanolamine of formula (I) where one of $R^1$ and $R^2$ is H, the other of $R^1$ and $R^2$ is a —$CH_3$ group and $R^3$ is H:

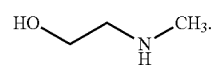

In one embodiment, the formulation includes the alkanolamine of formula (I) where each of $R^1$, $R^2$ and $R^3$ is —$CH_3$:

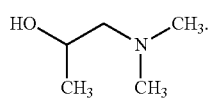

In one embodiment, the formulation includes the alkanolamine of formula (I) where each of $R^1$, $R^2$ is hydrogen and $R^3$ is —$CH_3$:

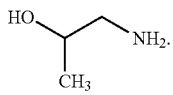

In one embodiment, the formulation includes the alkanolamine of formula (I) where one of $R^1$ and $R^2$ is H, the other of $R^1$ and $R^2$ is a substituted $C_1$-$C_6$ alkyl of the formula —$CH_2CH_2OH$ and $R^3$ is H:

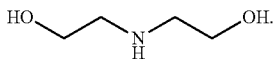

In one embodiment, the formulation includes the alkanolamine of formula (I) where both $R^1$ and $R^2$ is a substituted $C_1$-$C_6$ alkyl of the formula —$CH_2CH_2OH$ and $R^3$ is H:

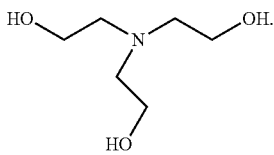

In one embodiment, the formulation includes the alkanolamine of formula (I) where one of $R^1$ and $R^2$ is H, the other of $R^1$ and $R^2$ is a substituted $C_1$-$C_6$ alkyl of the formula —$CH_2CH_2NH_2$ and $R^3$ is H:

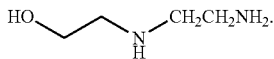

In one embodiment, the formulation includes the alkanolamine of formula (I) where each of $R^1$ and $R^2$ is —$CH_3$ and $R^3$ is H:

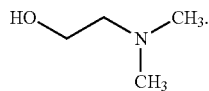

The disclosed and claimed subject matter is further directed to the use and synthesis of the disclosed and claimed chemical formulations.

In another embodiment, the above-described composition includes an additional or secondary solvent. Preferred secondary solvents include glycols, polyhydroxyl compounds, and the like.

A third aspect of the present disclosure includes electronic devices manufactured by the novel method disclosed.

Other features and advantages of the disclosed and claimed subject matter will be apparent from the following more detailed description, taken in conjunction with the example solutions which illustrate the principles of the disclosed and claimed subject matter.

This summary section does not specify every embodiment and/or incrementally novel aspect of the disclosed and claimed subject matter. Instead, this summary only provides a preliminary discussion of different embodiments and corresponding points of novelty over conventional techniques and the known art. For additional details and/or possible perspectives of the disclosed and claimed subject matter and embodiments, the reader is directed to the Detailed Description section of the disclosure as further discussed below.

The order of discussion of the different steps described herein has been presented for clarity sake. In general, the steps disclosed herein can be performed in any suitable order. Additionally, although each of the different features, techniques, configurations, etc. disclosed herein may be discussed in different places of this disclosure, it is intended that each of the concepts can be executed independently of each other or in combination with each other as appropriate. Accordingly, the disclosed and claimed subject matter can be embodied and viewed in many different ways.

DETAILED DESCRIPTION

For the purposes of promoting an understanding of what is claimed, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the disclosed and claimed subject matter (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosed and claimed subject matter and does not pose a limitation on the scope thereof unless otherwise claimed. No language in the specification should be construed as indicating any non-claimed element as essential to the practice of the disclosed and claimed subject matter.

Preferred embodiments of disclosed and claimed subject matter are described herein, including the best mode known to the inventors for carrying out the disclosed and claimed subject matter. Variations of those preferred embodiments may become apparent to those of ordinary skill in the art upon reading the foregoing description. The inventors expect skilled artisans to employ such variations as appropriate, and the inventors intend for the disclosed and claimed subject matter to be practiced otherwise than as specifically described herein. Accordingly, this disclosed and claimed subject matter includes all modifications and equivalents of the subject matter recited in the claims appended hereto as permitted by applicable law. Moreover, any combination of the above-described elements in all possible variations thereof is encompassed by the disclosed and claimed subject matter unless otherwise indicated herein or otherwise clearly contradicted by context.

For ease of reference, "microelectronic device" or "semiconductor substrates" correspond to semiconductor wafers, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly. The microelectronic device or semiconductor substrates may include low-k dielectric material, barrier materials, and metals, such as, AlCu alloys, W, Ti, TiN, one or more passivation layers, such as polyimide or polybenzoxazole, as well as other materials thereon.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than approximately 1 wt. %, more preferably less than approximately 0.5 wt. %, and most preferably less than approximately 0.2 wt. %. "Substantially free" also includes approximately 0.0 wt. %. The term "free of" means 0.0 wt. %.

In some embodiments, when describing a composition that is substantially free of water, it is intended to mean that water may be added with the components; however, the amount of water added with the components should be less than approximately 0.1 wt %; however, water may be absorbed from the atmosphere during manufacturing and use. In other embodiments, substantially free of water may refer to compositions for which the water is not present above approximately 1 wt %. In other embodiments, substantially free of water may refer to compositions for which the water is not present above approximately 3 wt %.

The term "about" or "approximately," when used in connection with a measurable numerical variable, refers to the indicated value of the variable and to all values of the variable that are within the experimental error of the indicated value (e.g., within the 95% confidence limit for the mean) or within percentage of the indicated value (e.g., ±10%, ±5%), whichever is greater.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Note all defined weight percents of the components unless otherwise indicated are based on the total weight of the composition. Further, all weight percents unless otherwise indicated are "neat" meaning that they do not include the aqueous solution in which they are present when added to the composition. Any reference to "at least one" could be substituted with "one or more". "At least one" and/or "one or more" includes "at least two" or "two or more" and "at least three" and "three or more" and so on.

The compositions include one or more organic solvents, one or more alkanolamines and/or one or more amines; one or more corrosion inhibitors and optionally one or more secondary solvents.

In a further embodiment, the composition consists essentially of (i) one or more alkanolamines, (ii) one or more ether alcohol solvents or aromatic containing alcohols and (iii) one or more corrosion inhibitors in varying concentrations. In such an embodiment, the combined amounts of (i), (ii) and (iii) do not equal 100% by weight, and can include other ingredients (e.g., additional solvent(s), including water, common additives and/or impurities) that do not materially change the effectiveness of the cleaning composition.

In another embodiment, the composition consists of (i) one or more alkanolamines, (ii) one or more ether alcohol solvents or aromatic containing alcohols and (iii) one or more corrosion inhibitors in varying concentrations. In such an embodiment, the combined amounts of (i), (ii) and (iii) equal approximately 100% by weight but may include other small and/or trace amounts of impurities that are present in such small quantities that they do not materially change the effectiveness of the composition. For example, in one such embodiment, the cleaning composition can contain 2% by weight or less of impurities. In another embodiment, the cleaning composition can contain 1% by weight or less than of impurities. In a further embodiment, the cleaning composition can contain 0.05% by weight or less than of impurities.

When referring to compositions of the inventive composition described herein in terms of weight %, it is understood that in no event shall the weight % of all components, including non-essential components, such as impurities, add to more than 100 weight %. In compositions "consisting essentially of" recited components, such components may add up to 100 weight % of the composition or may add up to less than 100 weight %. Where the components add up to less than 100 weight %, such composition may include some small amounts of a non-essential contaminants or impurities. For example, in one such embodiment, the composition can contain 2% by weight or less of impurities. In another embodiment, the rinse can contain 1% by weight or less than of impurities. In a further embodiment, the composition can contain 0.05% by weight or less than of impurities. In other such embodiments, the ingredients can form at least 90 wt %, more preferably at least 95 wt %, more preferably at least 99 wt %, more preferably at least 99.5 wt %, most preferably at least 99.9 wt %, and can include other ingredients that do not material affect the performance of the wet etchant. Otherwise, if no significant non-essential impurity component is present, it is understood that the composition of all essential constituent components will essentially add up to 100 weight %.

Solvent

The compositions according to this present disclosure typically include one or more organic solvents. One type of solvent that can be used in the compositions is ether alcohol solvents or an aromatic ring-containing alcohol solvent, or mixtures thereof. The ether alcohol solvent may be a glycol ether or other alcohols having an ether group. One or more ether alcohol solvents, including glycol ether solvents, may be used in the compositions. Suitable glycol ether solvents include diethylene glycol butyl ether (DB), diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, diethylene glycol diethyl ether, diethylene glycol (DEG), or dipropylene glycol. Examples of alcohol ether solvents that are not glycol ethers are 3-methoxy-3-methyl-1-butanol (MMB), furfuryl alcohol, tetrahydrofurfuryl alcohol. An example of an aromatic ring-containing alcohol solvent useful in the composition is alkanol substituted benzene, such as, benzyl alcohol, benzyl ethanol and benzyl propanol. Each solvent can be used alone, in mixtures of the same types or in combinations of any or all of the different types.

It is believed that, for most applications, the one or more alcohol ether solvents and/or aromatic containing alcohol will include, for example, from about 50% to about 90%, or 55% to about 90% by wt. of the composition. Other preferred embodiments of the disclosed and claimed subject matter may include from about 60% to about 88%, or 65% to 85% by wt. of the glycol ether solvent and/or aromatic containing alcohol. The alcohol ether solvent(s) and/or aromatic containing alcohol may be present in an amount that falls within a range defined by the following list of weight percents: 50, 55, 58, 60, 62, 65, 67, 70, 72, 75, 77, 80, 82, 85, 88 and 90. The aromatic ring-containing alcohol and/or aromatic containing alcohol can be present in the composition in an amount that falls within a range defined by the following list of weight percents: 50, 55, 58, 60, 62, 65, 67, 70, 72, 75, 77, 80, 82, 85, 88 and 90. In other embodiments, the one or more ether alcohol solvents and/or aromatic containing alcohol constitutes about 80 wt % to about 85 wt % of the composition. In other embodiments, the one or more ether alcohol solvents and/or aromatic containing alcohol constitutes about 30 wt % to about 50 wt % of the composition.

Some embodiments may contain from about 10% to about 50% of a secondary solvent, in addition to the ether alcohol solvents or the aromatic ring-containing alcohol solvents described above. Alternatively, in some embodiments, the stripper solutions may be free or substantially free of a secondary solvent.

Secondary organic solvent alcohols may be linear or branched chain aliphatic or aromatic alcohols. Examples of the secondary alcohols that the composition may comprise include methanol, ethanol, propanol, isopropyl alcohol, butanol, tert-butyl alcohol, tert-amyl alcohol, 3-methyl-3-pentanol, 1-octanol, 1-decanol, 1-undecanol, 1-dodecanol, 1-tridecanol, 1-tetradecanol, 1-pentadecanol, 1-hexadecanol, 9-hexadecen-1-ol, 1-heptadecanol, 1-octadecanol, 1-nonadecanol, 1-eicosanol, 1-heneicosanol, 1-docosanol, 13-docosen-1-ol, 1-tetracosanol, 1-hexacosanol, 1-heptacosanol, 1-octacosanol, 1-triacontanol, 1-dotriacontanol, 1-tetratriacontanol, cetearyl alcohol, propylene glycol, ethylene glycol and glycerol.

When used, the secondary organic solvent may comprise from about 0.02% to about 45%, or from about 0.08% to about 38%, or from about 0.1% to about 35%, or from about 0.2% to about 33%, or from about 0.3% to about 20% of the composition. In alternative embodiments the secondary solvent may be present in any amount defined by the endpoints selected from the following weight percents: 0.02, 0.08, 0.1, 0.2, 0.3, 0.4, 0.5, 0.7, 0.9, 1, 3, 5, 8, 10, 12, 15, 17, 20, 23, 25, 38, 30, 32, 35, 37, 40, 43 and 45.

Alkanolamine

Suitable alkanolamine has at least two carbon atoms, at least one amino substituent and at least one hydroxyl substituent, the amino and hydroxyl substituents attached to two different carbon atoms.

In some embodiments, the alkanolamine is a 1,2 alkanolamine of formula (I):

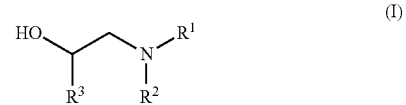

wherein each of $R^1$, $R^2$ and $R^3$ is independently selected from H, an unsubstituted $C_1$-$C_6$ alkyl, a substituted $C_1$-$C_6$ alkyl, a branched $C_3$-$C_6$ alkyl and a $C_1$-$C_6$ alkylamino. In some embodiments, each of $R^1$ and $R^2$ is independently selected from H, $C_1$-$C_4$ alkyl, or $C_1$-$C_4$ alkylamino. In one embodiment, $R^1$ is —H or —$CH_2CH_2NH_2$ and $R^2$ is H. In another embodiment, $R^1$ is —$CH_2CH_2NH_2$ and $R^2$ is —H. In another embodiment, both $R^1$ and $R^2$ are —H. In another embodiment, both $R^1$ and $R^2$ are —$CH_2CH_2OH$. In another embodiment, $R^3$ is —$CH_3$.

In one embodiment, the formulation includes the alkanolamine of formula (I) where one or both of $R^1$ and $R^2$ is H.

In one embodiment, the formulation includes the alkanolamine of formula (I) where each of $R^1$, $R^2$ and $R^3$ is H:

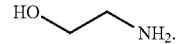

In one embodiment, the formulation includes the alkanolamine of formula (I) where one of $R^1$ and $R^2$ is H, the other of $R^1$ and $R^2$ is a —$CH_3$ group and $R^3$ is H:

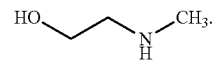

In one embodiment, the formulation includes the alkanolamine of formula (I) where each of $R^1$, $R^2$ and $R^3$ is —$CH_3$:

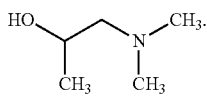

In one embodiment, the formulation includes the alkanolamine of formula (I) where each of $R^1$, $R^2$ is hydrogen and $R^3$ is —$CH_3$:

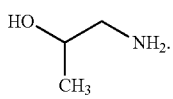

In one embodiment, the formulation includes the alkanolamine of formula (I) where one of $R^1$ and $R^2$ is H, the other of $R^1$ and $R^2$ is a substituted $C_1$-$C_6$ alkyl of the formula —$CH_2CH_2OH$ and $R^3$ is H:

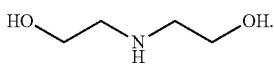

In one embodiment, the formulation includes the alkanolamine of formula (I) where both $R^1$ and $R^2$ is a substituted $C_1$-$C_6$ alkyl of the formula —$CH_2CH_2OH$ and $R^3$ is H:

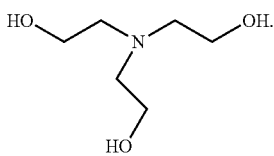

In one embodiment, the formulation includes the alkanolamine of formula (I) where one of $R^1$ and $R^2$ is H, the other of $R^1$ and $R^2$ is a substituted $C_1$-$C_6$ alkyl of the formula —$CH_2CH_2NH_2$ and $R^3$ is H:

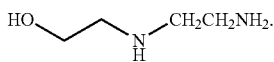

In one embodiment, the formulation includes the alkanolamine of formula (I) where each of $R^1$ and $R^2$ is —$CH_3$ and $R^3$ is H:

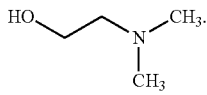

Suitable alkanolamines include, but are not limited to, ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxy)ethanol.

Suitable levels of the required for at least one of an alkanolamine and an amine can range from about 5% to about 50% of the composition. In some embodiments, the alkanolamine and/or amine is from about 10% to about 30% of the composition. In alternative embodiments the alkanolamine and/or amine may be present in any amount defined by the endpoints selected from the following weight percents: 2, 5, 8, 10, 12, 15, 17, 20, 22, 25, 27, 30, 32, 35, 38, 40, 42, 45, 48 and 50.

The sum of the weight percent of the organic solvents which may be the alcohol ether solvent and the secondary solvent and the weight percent of the alkanolamine and/or amine in the compositions may be from about 90% to about 99.9%. In other embodiments, the compositions may contain from about 55% to about 99%, or from about 65% to about 98%, or from about 70% to about 97% or from about 75% to about 99.9%, or from about 80% to about 98%, or from about 85% to about 99%, or from about 85% to about 96%, or from about 90% to about 97%, or from about 75% to about 90% organic solvent and the alkanolamine and/or amine. In some embodiments, the weight percent is greater than the weight percent alkanolamine and/or amine, and the organic solvent may be present in the composition at an amount from 20% to about 90%, or from 30% to about 90%, or from 50% to about 80%, or from 60% to about 80%. In some embodiments, the solutions may comprise from about 20% to about 90%, or from about 55% to about 60%, or from 30% to about 50%, or from 35% to about 45%, or from about 55% to about 75% glycol ether.

Corrosion Inhibitors

The compositions contain one or more, or two or more, corrosion inhibitors. Suitable corrosion inhibitors include, but are not limited to, organic corrosion inhibitors, including aromatic hydroxyl compounds, and aromatic polyhydroxyl compounds such as catechol and resorcinol; alkylcatechols, such as methylcatechol, ethylcatechol and t-butylcatechol, phenols and pyrogallol; aromatic triazoles such as benzotriazole; alkylbenzotriazoles and aminobenzotriazoles, such as, 1-aminobenzotriazole; thiazoles, such as, 2-aminobenzothiazole (ABT); sugar alcohols such as glycerol, xylitol and sorbitol; carboxylic acids, such as sebacic acid, formic acid, acetic acid, propionic acid, butyric acid, isobutyric acid, oxalic acid, malonic acid, succinic acid, glutaric acid, maleic acid, fumaric acid, benzoic acid, phtahlic acid, 1,2, 3-benzenetricarboxylic acid, glycolic acid, lactic acid, malic acid, citric acid, acetic anhydride, phthalic anhydride, maleic anhydride, succinic anhydride, salicylic acid, gallic acid, and gallic acid esters such as methyl gallate and propyl gallate; metal salts such as copper (II) nitrate; copper (II) bromide;

copper (II) chlorate; copper (II) chloride; copper (II) fluorosilicate; copper (II) formate; copper (II) selenate; copper (II) sulfate; organic salts of carboxyl containing organic containing compounds described above, and the like, and chelate compounds such as phosphoric acid-based chelate compounds including 1,2-propanediaminetetramethylene phosphonic acid and hydroxyethane phosphonic acid, carboxylic acid-based chelate compounds such as ethylenediaminetetraacetic acid and its sodium and ammonium salts, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime. In other embodiments, the one or more corrosion inhibitors may comprise one or more copper salts, such as, copper (II) nitrate; copper (II) bromide; copper (II) chlorate; copper (II) chloride; copper (II) fluorosilicate; copper (II) formate; copper (II) selenate; and/or copper (II) sulfate alone. In yet other embodiments, the compositions may include one or more of the organic corrosion inhibitors and/or chelate compounds above and one or more copper salts. In yet other embodiments, the one or more corrosion inhibitors may be copper (II) nitrate (e.g., NADA is about 42% copper(II) nitrate hemi(pentahydrate-oxidizer) and NADA/1N is about 26.3% copper(II) nitrate hemi(pentahydrate-non-oxidizer)), copper (II) bromide; copper (II) chlorate; copper (II) chloride; copper (II) fluorosilicate; copper (II) formate; copper (II) selenate; copper (II) sulfate and/or resorcinol. In yet another embodiment the corrosion inhibitor may include copper (II) nitrate (i.e., NADA or NADA/1N) and resorcinol.

In other embodiments the corrosion inhibitor can include aliphatic or aromatic polyhydroxyl compounds which include, ethylene glycol; 1,2-propanediol (propylene glycol); 1,3-propanediol, 1,2,3-propanetriol; 1,2-butanediol; 1,3-propanediol; 2,3-butanediol; 1,4-butanediol; 1,2,3-butanetriol; 1,2,4-butanetriol; 1,2-pentanediol; 1,3-pentanediol; 1,4-pentandiol; 2,3-pentanediol; 2,4-pentandiol; 3,4-pentanediol; 1,2,3-pentanetriol; 1,2,4-pentanetriol; 1,2,5-pentanetriol; 1,3,5-pentanetriol; etohexadiol; p-methane-3,8-polyhydroxyl compound; 2-methyl-2,4-pentanediol; 2,2-dimethyl-1,3-propanediol; glycerin; trimethylolpropane; xylitol; arabitol; 1,2- or 1,3-cyclopentanediol; 1,2- or 1,3-cyclohexanediol; 2,3-norbornanediol; 1,8-octanediol; 1,2-cyclohexane-dimethanol; 1,3-cyclohexanedimethanol; 1,4-cyclohexanedimethanol; 2,2,4-trimethyl-1,3-pentanediol; hydroxypivalyl hydroxypivalate; 2-methyl-1,3-propanediol; 2-butyl-2-ethyl-1,3-propanediol; 2-ethyl-2-isobutyl-1,3-propanediol; 1,6-hexanediol; 2,2,4,4-tetramethyl-1,6-hexanediol; 1,10-decanediol; 1,4-benzenedimethanol; hydrogenated bisphenol A; 1,1,1-trimethylolpropane; 1,1,1-trimethylolethane; pentaerythritol; erythritol; threitol; dipentaerythritol; sorbitol; and the like, and combinations of 2 or more of the aforementioned polyhydroxyl compounds.

In some embodiments one or more organic corrosion inhibitors selected from the lists described above may be present in the compositions useful at levels ranging from about 0.005 wt % to about 10 wt %. In an embodiment, the solution may contain about 0.25 weight percent to about 5 weight percent or 0.1 weight percent to about 4 weight percent or 0.25 weight percent to about 2 weight percent. The one or more corrosion inhibitors may be present in any amount defined by the endpoints selected from the following weight percents: 0.005, 0.02, 0.08, 0.1, 0.2, 0.25, 0.3, 0.4, 0.5, 0.7, 0.9, 1, 2, 3, 4, 5, 6, 7, 8, 9 and 10. A first and second corrosion inhibitor may be used in the composition. A preferred first and/or second corrosion inhibitor is copper nitrate salt (e.g., NADA or NADA/1N) and resorcinol. This disclosed and claimed subject matter includes the method of treating semiconductor substrates with the compositions to remove photoresist without damaging the films, layers, metals or other structures present on the substrates, including passivation layers, such as PI and PBO. Preferred temperatures for treating the semiconductor substrates are about 50° C. For a majority of applications, temperatures of from about 45° C. to about 85° C. are useful or from about 50° C. to about 75° C. For particular applications where the substrate is either sensitive or longer removal times are required, lower contacting temperatures are appropriate. For example, when reworking substrates, it may be appropriate to maintain the stripper solution at a temperature of at least 20° C. for a longer time to remove the photoresist and avoid damaging to the substrate.

As noted above, in one embodiment, the one or more corrosion inhibitors comprises about 0.005 wt % to about 10 wt % of the composition. In a further aspect of this embodiment, the one or more corrosion inhibitors comprises about 0.25 weight percent to about 5 weight percent of the composition. In a further aspect of this embodiment, the one or more corrosion inhibitors comprises about 0.1 weight percent to about 4 weight percent of the composition. In a further aspect of this embodiment, the one or more corrosion inhibitors comprises about 0.25 weight percent to about 2 weight percent of the composition. In a further aspect of this embodiment, the one or more corrosion inhibitors comprises about 0.005 wt % of the composition. In a further aspect of this embodiment, the one or more corrosion inhibitors comprises about 0.02 wt % of the composition. In a further aspect of this embodiment, the one or more corrosion inhibitors comprises about 0.08 wt % of the composition. In a further aspect of this embodiment, the one or more corrosion inhibitors comprises about 0.1 wt % of the composition. In a further aspect of this embodiment, the one or more corrosion inhibitors comprises about 0.2 wt % of the composition. In a further aspect of this embodiment, the one or more corrosion inhibitors comprises about 0.25 wt % of the composition. In a further aspect of this embodiment, the one or more corrosion inhibitors comprises about 0.3 wt % of the composition. In a further aspect of this embodiment, the one or more corrosion inhibitors comprises about 0.4 wt % of the composition. In a further aspect of this embodiment, the one or more corrosion inhibitors comprises about 0.5 wt % of the composition. In a further aspect of this embodiment, the one or more corrosion inhibitors comprises about 0.7 wt % of the composition. In a further aspect of this embodiment, the one or more corrosion inhibitors comprises about 0.9 wt % of the composition. In a further aspect of this embodiment, the one or more corrosion inhibitors comprises about 1 wt % of the composition. In a further aspect of this embodiment, the one or more corrosion inhibitors comprises about 2 wt % of the composition. In a further aspect of this embodiment, the one or more corrosion inhibitors comprises about 3 wt % of the composition. In a further aspect of this embodiment, the one or more corrosion inhibitors comprises about 4 wt % of the composition. In a further aspect of this embodiment, the one or more corrosion inhibitors comprises about 5 wt % of the composition. In a further aspect of this embodiment, the one or more corrosion inhibitors comprises about 6 wt % of the composition. In a further aspect of this embodiment, the one or more corrosion inhibitors comprises about 7 wt % of the composition. In a further aspect of this embodiment, the one or more corrosion inhibitors comprises about 8 wt % of the composition. In a further aspect of this embodiment, the one or more corrosion inhibitors comprises about 9 wt % of the composition. In a further aspect of this embodiment, the one or more corrosion inhibitors comprises about 10 wt % of the composition.

In another embodiment, the one or more corrosion inhibitors comprises catechol. In a further aspect of this embodiment, the one or more corrosion inhibitors comprises about 0.5 wt % to about 1.5 wt % of catechol. In a further aspect of this embodiment, the one or more corrosion inhibitors consists essentially of catechol. In a further aspect of this embodiment, the one or more corrosion inhibitors consists essentially of about 0.5 wt % to about 1.5 wt % of catechol. In a further aspect of this embodiment, the one or more corrosion inhibitors consists of catechol. In a further aspect of this embodiment, the one or more corrosion inhibitors consists of about 0.5 wt % to about 1.5 wt % of catechol.

In another embodiment, the one or more corrosion inhibitors comprises resorcinol. In a further aspect of this embodiment, the one or more corrosion inhibitors comprises about 0.5 wt % to about 1.5 wt % of resorcinol. In a further aspect of this embodiment, the one or more corrosion inhibitors consists essentially of resorcinol. In a further aspect of this embodiment, the one or more corrosion inhibitors consists essentially of about 0.5 wt % to about 1.5 wt % of resorcinol. In a further aspect of this embodiment, the one or more corrosion inhibitors consists of resorcinol. In a further aspect of this embodiment, the one or more corrosion inhibitors consists of about 0.5 wt % to about 1.5 wt % of resorcinol.

In another embodiment, the one or more corrosion inhibitors comprises glycerol. In a further aspect of this embodiment, the one or more corrosion inhibitors comprises about 0.5 wt % to about 1.5 wt % of glycerol. In a further aspect of this embodiment, the one or more corrosion inhibitors consists essentially of glycerol. In a further aspect of this embodiment, the one or more corrosion inhibitors consists essentially of about 0.5 wt % to about 1.5 wt % of glycerol. In a further aspect of this embodiment, the one or more corrosion inhibitors consists of glycerol. In a further aspect of this embodiment, the one or more corrosion inhibitors consists of about 0.5 wt % to about 1.5 wt % of glycerol.

In another embodiment, the one or more corrosion inhibitors comprises sebacic acid. In a further aspect of this embodiment, the one or more corrosion inhibitors comprises about 0.5 wt % to about 1.5 wt % of sebacic acid. In a further aspect of this embodiment, the one or more corrosion inhibitors consists essentially of sebacic acid. In a further aspect of this embodiment, the one or more corrosion inhibitors consists essentially of about 0.5 wt % to about 1.5 wt % of sebacic acid. In a further aspect of this embodiment, the one or more corrosion inhibitors consists of sebacic acid. In a further aspect of this embodiment, the one or more corrosion inhibitors consists of about 0.5 wt % to about 1.5 wt % of sebacic acid.

In another embodiment, the one or more corrosion inhibitors comprises a copper nitrate salt and resorcinol. In a further aspect of this embodiment, the one or more corrosion inhibitors consists essentially of a copper nitrate salt and resorcinol. In a further aspect of this embodiment, the one or more corrosion inhibitors consists of a copper nitrate salt and resorcinol.

In another embodiment, the one or more corrosion inhibitors comprises a copper nitrate salt. In a further aspect of this embodiment, the one or more corrosion inhibitors consists essentially of a copper nitrate salt. In a further aspect of this embodiment, the one or more corrosion inhibitors consists of a copper nitrate.

When immersing a substrate, agitation of the composition additionally facilitates photoresist removal. Agitation can be affected by mechanical stirring, circulating, or by bubbling an inert gas through the composition. Upon removal of the desired amount of photoresist, the substrate is removed from contact with the stripper solution and rinsed with water or an alcohol. DI water is a preferred form of water and isopropanol (IPA) is a preferred alcohol; however, rinsing with alcohol is optional. For substrates having components subject to oxidation, rinsing is preferably done under an inert atmosphere. The preferred stripper solutions according to the present disclosure have improved loading capacities for photoresist materials compared to current commercial products and are able to process a larger number of substrates with a given volume of stripper solution.

The stripper solutions provided in this disclosure can be used to remove polymeric resist materials present in a single layer or certain types of bilayer resists. For example, bilayer resists typically have either a first inorganic layer covered by a second polymeric layer or can have two polymeric layers. Utilizing the methods taught below, a single layer of polymeric resist can be effectively removed from a standard wafer having a single polymer layer. The same methods can also be used to remove a single polymer layer from a wafer having a bilayer composed of a first inorganic layer and a second or outer polymer layer. Finally, two polymer layers can be effectively removed from a wafer having a bilayer composed of two polymeric layers.

This disclosure describes chemical solutions used for removal of thick and thin photoresists. Thick photoresists may be a resist of from about 5 µm to about 100 µm or more, or about 15 µm to 100 µm, or from about 20 µm to about 100 µm in advanced packaging applications for semiconductor devices. In other cases, the chemical solutions may be used to remove photoresist from about 1 µm to about 100 µm or more, or about 2 µm to 100 µm, or from about 3 µm to about 100 µm. In one embodiment, the solutions described contain glycol ether, monoethanolamine (MEA), and at least two corrosion inhibitors. The stripper solutions of are also or alternatively substantially free of strong bases (e.g., quaternary ammonium hydroxide, KOH) and/or water.

Some embodiments of the compositions may be substantially free of, alternatively free of (as those terms were defined earlier) one or more than one of the following in any combination: nitrogen containing solvents, bis-choline salts, tri-choline salts, oxoammonium compounds, hydroxylamines and derivatives thereof, hydrogen peroxide, oxidants, inorganic acids, inorganic bases, metal hydroxides, NMP, surfactants, metal-containing compounds, and combinations of any of the them. In other embodiments, the composition will be substantially free of (or free of) sodium, and/or calcium, and/or amino carboxylic acids, and/or alcohols, and/or ethylene diamine, and/or ethylene triamine, and/or thiophenol. In some embodiments, the compositions disclosed herein are formulated to be substantially free or free of at least one of the following chemical compounds: alkyl thiols, and organic silanes. In some embodiments, the compositions disclosed herein are formulated to be substantially free or free of one or more of the following: halide-containing compound, for example it may be substantially free or free of one or more of the following: fluoride-, bromine-, chlorine- or iodine-containing compounds. In other embodiments, the composition may be substantially free or free of sulfonic acid and/or phosphoric acid and/or sulfuric acid and/or nitric acid and/or hydrochloric acid. In other embodiments, the composition may be substantially free or free of sulfates and/or nitrates and/or sulfites and/or nitrites. In other embodiments, the composition may be substantially free or free of: ethyl diamine, sodium-containing compounds and/or calcium-containing compounds and/or manganese-containing compounds or magnesium-containing compounds and/or chromium-containing compounds and/or sulfur-containing compounds and/or silane-containing compounds and/or phosphorus-containing compounds. Some embodiments may be substantially free of or free of surfactants. Some embodiments may be substantially free or free of amphoteric salts, and/or cationic surfactants, and/or anionic surfactants, and/or zwitterionic surfactants, and/or non-ionic surfactants. Some embodiments may be substantially free of or free of imidizoles, and/or anhydrides. Some embodiments may be substantially free of or free of pyrrolidones, and/or acetamides. Some embodiments may be substantially free or free of any amines (other than alkanolamines). Some embodiments may be substantially free of or free of peroxy-compounds, and/or peroxides, and/or persulfates, and/or percarbonates, and acids thereof, and salts thereof. Some embodiments may be substantially free of or free of iodates, and/or perboric acid, and/or percarbonates, and/or peroxyacids, and/or cerium compounds, and/or cyanides, and/or periodic acid and/or ammonium molybdate, and/or ammonia and/or abrasives. The components that the compositions may be free of may be in any combination of components as if all of the combinations were set forth herein.

The composition of the disclosed and claimed subject matter may also include one or more of the following additives: dyes and biocides. The additive(s) may be added to the extent that they do not adversely affect the performance of the composition, typically in amounts up to a total of about 5 weight % of the composition. In other embodiments the composition will be substantially free of or free of dyes, biocides and/or other additives.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials and Methods

All materials used in this patent were purchased from and/or are available from Sigma Aldrich and were used in the formulations as received.

Resist cleaning performance and polyimide (PI) or polybenzoxazole (PBO) compatibility ware inspected using optical microscope and scanning electron microscope. Cu etch rates are determined by measuring film thickness using four-point probe RESMAP before and after processing in the formulations.

The follow abbreviations are used in the various compositions in the tables below:

| Abbreviation | Full name |
| --- | --- |
| NMP | N-methylpyrrolidone |
| MEA | Monoethanolamine |
| NMEA | N-methylethanolamine |
| DMEA | Dimethylethanolamine |
| DETA | Diethylenetriamine |
| BA | Benzyl amine |
| DB | diethylene glycol monobutyl ether |
| MMB | 3-Methoxy-3-methyl-1-butanol |
| DPGME | dipropylene glycol monomethyl ether |
| TEGME | Triethylene Glycol Monomethyl Ether |
| ABT | 2-Aminobenzothiazole |
| NADA | 42% Copper(II) nitrate hemi(pentahydrate) aqueous solution |
| 1N NADA | 26.3% Copper(II) nitrate hemi(pentahydrate) aqueous solution |
| CR4000 | Positive tone spin-on photoresist from TOK |
| PBO | Polybenzoxazole |
| PI | Polyimide |

The low temperature cure PI is a polyimide passivation layer (or insulation layer) that is cured at less than approximately 220° C.

In the examples, various stripping compositions (examples and comparative examples) comprising the formulations identified in the tables below were tested for their ability to remove photoresist from semiconductor wafer samples. The coupon-sized samples of semiconductor wafers were silicon wafers plated with Cu pillars and Sn/Ag solder caps having a thick layer of spin-on photoresist thereon. The photoresist removal was performed using an immersion process in a beaker. The photoresist on the test coupons was a positive spin on photoresist. Other test coupons had a passivation layer of polyimide (PI) on them. Still other test coupons also had a passivation layer of polybenzoxazole (PBO) on them.

Table 1 lists the results for testing NMP for PI/PBO compatibility and photoresist removal effectiveness. The test results reported in Table 1 were for photoresist removal from photoresist coupons, and compatibility with separate coupons each having either PBO passivation layer coupon or PI passivation layer at the process conditions (temperature and time) specified.

TABLE 1

| Comparative Example Formulation-NMP | | |
| --- | --- | --- |
| Raw Material | | NMP |
| NMP (CAS No. 872-50-4) | | 100 |
| Total | | 100.00 |
| Process Temp. | | 80° C. |
| CR4000 Resist cleaning | 5 min | barely touched |
| | 10 min | partly clean |
| | 15 min | partly clean |
| Low Temperature Cure PI (Passivation Layer) | 60 min | Good |
| | 120 min | Slight crack |
| PBO (Passivation layer) | 120 min | OK but dent on surface |

TABLE 2

Example Formulations

| | Ex. 1 wt % | Ex. 2 wt % | Ex. 3 wt % | Ex. 4 wt % |
|---|---|---|---|---|
| MEA | 30 | 30 | 30 | 30 |
| MMB | 20 | 40 | 20 | 40 |
| DB | 49.975 | 29.975 | 49.475 | 29.475 |
| NADA | 0.025 | 0.025 | 0.025 | 0.025 |
| Glycerol | — | — | 0.5 | 0.5 |
| Total | 100 | 100 | 100 | 100 |

TABLE 3

Example Formulations

| | Ex. 5 wt % | Ex. 6 wt % | Ex. 7 wt % |
|---|---|---|---|
| MEA | 30 | 20 | 15 |
| DB | 68.975 | 79.475 | 84 |
| NADA | 0.025 | 0.025 | — |
| Glycerol | 1 | 0.5 | 1 |
| Total | 100 | 100 | 100 |

TABLE 4

Example Formulations

| | Ex. 8 wt % | Ex. 9 wt % | Ex. 10 wt % |
|---|---|---|---|
| MEA | 15 | — | — |
| DMEA | — | 15 | — |
| NMEA | — | — | 15 |
| DB | 83 | 84 | 84 |
| Glycerol | — | 1 | — |
| Resorcinol | 1 | — | 1 |
| ABT | 1 | — | — |
| Total | 100 | 100 | 100 |

TABLE 5

Example Formulations

| | Ex. 11 wt % | Ex. 12 wt % | Ex. 13 wt % | Ex. 14 wt % |
|---|---|---|---|---|
| MEA | 15 | 15 | 15 | 15 |
| DB | 83.96 | — | — | — |
| MMB | — | 83.96 | — | 15 |
| DI water | — | — | 83.96 | 69.96 |
| Resorcinol | 1 | — | 1 | 1 |
| Glycerol | — | 1 | — | — |
| 1N NADA | 0.04 | 0.04 | 0.04 | 0.04 |
| Total | 100 | 100 | 100 | 100 |

TABLE 6

Example Formulations

| | Ex. 15 wt % | Ex. 16 wt % | Ex. 17 wt % | Ex. 18 wt % | Ex. 19 wt % |
|---|---|---|---|---|---|
| MEA | 15 | 15 | 15 | 15 | 15 |
| DB | 83.5 | 84.5 | 83.46 | — | — |
| Benzyl Alcohol | — | — | — | 84 | — |
| Propylene Glycol | — | — | — | — | 84 |
| Resorcinol | 1.5 | — | 1 | 1 | 1 |
| Sebacic Acid | — | 0.5 | 0.5 | — | — |
| 1N NADA | — | — | 0.04 | — | — |
| Total | 100 | 100 | 100 | 100 | 100 |

TABLE 7

Example Formulations

| Ex. | 20 | 21 | 22 | 23 | 24 | 25 |
|---|---|---|---|---|---|---|
| MEA | 30 | 30 | 30 | 30 | — | — |
| DETA | — | — | — | — | 15 | — |
| Octylamine | — | — | — | — | — | 15 |
| DB | 68.96 | — | — | — | 84 | 84 |
| MMB | — | 68.96 | — | — | — | — |
| DPGME | — | — | 68.96 | — | — | — |
| TEGME | — | — | — | 68.96 | — | — |
| 1N NADA | 0.04 | 0.04 | 0.04 | 0.04 | — | — |
| Resorcinol | 1 | 1 | 1 | 1 | 1 | 1 |
| Total | 100 | 100 | 100 | 100 | 100 | 100 |

TABLE 8

Example Formulations

| Ex. | 26 | 27 | 28 | 29 | 30 | 31 | 32 | 33 |
|---|---|---|---|---|---|---|---|---|
| MEA | 15 | 15 | 15 | 15 | 15 | 15 | 15 | 15 |
| DB | 85 | 84.5 | 84.5 | 84.5 | 84.5 | 84.5 | 84.5 | 84.5 |
| Resorcinol | — | 0.5 | — | — | — | — | — | — |
| 8-Hydroquinoline | — | — | 0.5 | — | — | — | — | — |
| Catechol | — | — | — | 0.5 | — | — | — | — |
| 2-Amino-benzotriazole (BTA/ABT) | — | — | — | — | 0.5 | — | — | — |
| Cysteine | — | — | — | — | — | 0.5 | — | — |
| D-Sorbitol | — | — | — | — | — | — | 0.5 | — |
| Glycerol | — | — | — | — | — | — | — | 0.5 |
| Total | 100 | 100 | 100 | 100 | 100 | 100 | 100 | 100 |

TABLE 9

Example Formulations

| | Ex. 34 | Ex. 35 | Ex. 36 | Ex. 37 | Ex. 38 |
|---|---|---|---|---|---|
| MEA | 15 | 15 | 15 | 15 | 15 |
| DB | 84.5 | 84 | 83 | 82 | 84 |
| Resorcinol | 0.5 | 1 | 2 | 3 | — |
| Glycerol | — | — | — | — | 1 |
| Total | 100 | 100 | 100 | 100 | 100 |

TABLE 10

| | Example Formulations | | | | | | | | | | |
|---|---|---|---|---|---|---|---|---|---|---|---|
| Ex. | 39 | 40 | 41 | 42 | 43 | 44 | 45 | 46 | 47 | 48 | 49 |
| MEA | 15 | 15 | 15 | 15 | 15 | 15 | 15 | 15 | 15 | 15 | 15 |
| DB | 84.96 | 84.46 | 84.46 | 84.46 | 84.46 | 84.46 | 84.46 | 84.46 | 84 | 84 | 84 |
| 1N NADA | 0.04 | 0.04 | 0.04 | 0.04 | 0.04 | 0.04 | 0.04 | 0.04 | — | — | — |
| Resorcinol | — | 0.5 | — | — | — | — | — | — | 0.5 | — | 0.5 |
| 8-Hydroquinoline | — | — | 0.5 | — | — | — | — | — | — | — | — |
| Catechol | — | — | — | 0.5 | — | — | — | — | 0.5 | 0.5 | — |
| 2-Aminobenzotriazole (BTA/ABT) | — | — | — | — | 0.5 | — | — | — | — | — | — |
| D-Sorbitol | — | — | — | — | — | 0.5 | — | — | — | — | — |
| Glycerol | — | — | — | — | — | — | 0.5 | — | — | — | — |
| Sebacic acid | — | — | — | — | — | — | — | 0.5 | — | 0.5 | 0.5 |
| Total | 100 | 100 | 100 | 100 | 100 | 100 | 100 | 100 | 100 | 100 | 100 |

Analysis of Example Formulations
Analysis 1A: Resist Cleaning Performance

Tables 11-14 list various inventive and comparative stripping compositions that were tested using an immersion process and semiconductor wafers with 50 μm thick CR4000 positive spin-on photoresist with plated Cu pillars with Sn/Ag solder caps. For the immersion process, coupon-sized samples of semiconductor wafers were processed in beakers. Beakers were filled with 100.0 grams of a stripping composition and heated to the target temperature of 50° C. or 60° C. When the stripping composition was at the process temperature, a coupon was placed in a holder in the beaker, and slight agitation was provided by a stir bar. Temperature was maintained at the process temperature while contacting the coupons during the cleaning process. After a set processing, the coupons were removed from the beaker, rinsed with DI water and IPA, and dried with a stream of nitrogen.

Resist removal is defined as "clean" if all resist was removed from the wafer coupon surface; as "mostly clean" if at least 95% of the resist was removed from the surface; "partly clean" if about 80% of the resist was removed from the surface. The NMP comparative example was not able to completely remove the resist after 15 minutes at 80° C. and all the other exemplified compositions were able to completely remove the resist after 15 minutes at 50° C. or 60° C. except example 13, 19 and 25 where the coupon is partly clean after 15 minutes.

Analysis 1B: PI/PBO Compatibility

Tables 11-14 also provide the results from evaluating with low temperature cured polyimide (PI) films and polybenzoxazole (PBO) films. These tests were performed using semiconductor wafers patterned with cured PI films or cured PBO films. For the immersion process, coupon-sized samples of semiconductor wafers were processed in beakers. Beakers were filled with 100 grams of a stripping composition and heated to the target temperature. When the stripping composition was at the process temperature, a coupon was placed in a holder in the beaker, and slight agitation was provided by a stir bar. Temperature was maintained at the process temperature throughout the process. After a total processing time of 60 minutes or 120 minutes, the coupons were removed from the beaker, rinsed with DI water and IPA, and dried with a stream of nitrogen.

The pattern of the polyimide films was monitored using optical microscope and scanning electronic microscope before and after processing for each coupon that was tested. Any cracks were noted as an indicator of poor compatibility of PI and PBO. Factors affecting PI and PBO compatibility include solvent and alkanolamine or amine. NMP processed PI showed slight crack after 120 minutes. Formulation 7-14, 18, 19, 24 and 25 demonstrated good compatibility with PI after 120 minutes while formulations 1-6 and 20-23 showed poor compatibility with PI after 120 minutes. All the comparative and inventive formulations 1-25 had good compatibility with PBO after 120 minutes.

TABLE 11

Solvent Effect on Resist Removal and PI/PBO Compatibility

| Ex. | Comp. | 11 | 12 | 13 | 14 | 18 | 19 |
|---|---|---|---|---|---|---|---|
| NMP | 100 | — | — | — | — | — | — |
| MEA | — | 15 | 15 | 15 | 15 | 15 | 15 |
| DB | — | 83.96 | — | — | — | — | — |
| Benzyl Alcohol | — | — | — | — | — | 84 | — |
| Propylene Glycol | — | — | — | — | — | — | 84 |
| MMB | — | — | 83.96 | 15 | — | — | — |
| DI Water | — | — | — | 83.96 | 69.96 | — | — |
| Resorcinol | — | 1 | — | 1 | 1 | 1 | 1 |
| Glycerol | — | — | 1 | — | — | — | — |
| 1N NADA | — | 0.04 | 0.04 | 0.04 | 0.04 | — | — |
| Total | 100 | 100 | 100 | 100 | 100 | 100 | 100 |
| Temperature/° C. | 80 | 50 | 50 | 50 | 50 | 50 | 50 |
| Resist Removal (10 minutes) | Partly Clean | Clean | Partly Clean | Barely touched | Partly Clean | Partly Clean | Partly Clean |
| Resist Removal (15 minutes) | Partly Clean | Clean | Clean | Partly Clean | Clean | Clean | Partly Clean |
| PBO Compatibility (120 minutes) | Slight Attack | Good | Good | Good | Good | Good | Good |
| PI Compatibility (60 minutes) | Slight Attack | Good | Good | Good | Good | Good | Good |
| PI Compatibility (120 minutes) | OK, Surface Dent | Good | Good | Good | Good | Good | Good |

TABLE 12

Solvent or Solvent Mixture Effect on Resist Removal and PI/PBO Compatibility

| Ex. | 1 | 2 | 3 | 4 | 14 | 20 | 21 | 22 | 23 |
|---|---|---|---|---|---|---|---|---|---|
| MEA | 30 | 30 | 30 | 30 | 15 | 30 | 30 | 30 | 30 |
| DB | 20 | 40 | 20 | 40 | — | 68.96 | — | — | — |
| MMB | 49.975 | 29.975 | 49.475 | 29.475 | 15 | — | 68.96 | — | — |
| DI water | — | 68.96 | — | — | — | — | — | — | — |
| DPGME | — | — | — | — | — | — | — | 68.96 | — |
| TEGME | — | — | — | — | — | — | — | — | 68.96 |
| NADA | 0.025 | 0.025 | 0.025 | 0.025 | — | — | — | — | — |
| 1N NADA | — | — | — | 0.04 | 0.04 | 0.04 | 0.04 | 0.04 | — |
| Glycerol | — | — | 0.5 | 0.5 | — | — | — | — | — |
| Resorcinol | — | — | 1 | 1 | 1 | 1 | 1 | — | — |
| Total | 100 | 100 | 100 | 100 | 100 | — | — | — | — |
| Temperature/° C. | 60 | 60 | 50 | 50 | 50 | 60 | 60 | 60 | 60 |
| Resist removal (10 minutes) | Clean | Clean | Clean | Clean | Partly clean | Clean | Clean | Clean | Clean |
| Resist removal (15 minutes) | Clean | Clean | Clean | Clean | Clean | Clean | Clean | Clean | Clean |
| PBO compatibility (120 minutes) | Good | Good | Good | Good | Good | Good | Good | Good | Good |
| PI compatibility (60 minutes) | Slight crack | Slight crack | Good | Slight crack | Good | Crack | Crack | Crack | Crack |
| PI compatibility (120 minutes) | Crack | Crack | Slight crack | Crack | Good | — | — | — | — |

TABLE 13

Amine/Alkanolamine Effect on Resist Removal and PI/PBO Compatibility

| | Ex. | | | | |
|---|---|---|---|---|---|
| | 8 | 9 | 10 | 24 | 25 |
| MEA | 15 | — | — | — | — |
| DMEA | — | 15 | — | — | — |
| NMEA | — | — | 15 | — | — |
| DETA | — | — | — | 15 | — |
| Octylamine | — | — | — | — | 15 |
| DB | 83 | 84 | 84 | 84 | 84 |
| Glycerol | — | 1 | — | — | — |
| Resorcinol | 1 | — | 1 | 1 | 1 |
| ABT | 1 | — | — | — | — |
| Total | 100 | 100 | 100 | 100 | 100 |
| Temperature/° C. | 50 | 50 | 50 | 50 | 50 |
| Resist removal (10 minutes) | Clean | Clean | Clean | Partly Clean | Partly Clean |
| Resist removal (15 minutes) | Clean | Clean | Clean | Clean | Partly Clean |
| PBO compatibility (120 minutes) | Good | Good | Good | Good | Good |
| PI compatibility (60 minutes) | Good | Good | Good | Good | Good |
| PI compatibility (120 minutes) | Good | Good | Good | Good | Good |

TABLE 14

Alkanolamine Conc. Effect on Resist Removal and PI/PBO Compatibility

| | Ex. | | |
|---|---|---|---|
| | 5 | 6 | 7 |
| MEA | 30 | 20 | 15 |
| DB | 68.975 | 79.475 | 84 |
| NADA | 0.025 | 0.025 | — |
| Glycerol | 1 | 0.5 | 1 |
| Total | 100 | 100 | 100 |
| Temperature/° C. | 50 | 50 | 50 |
| Resist removal (10 minutes) | Clean | Clean | Clean |
| Resist removal (15 minutes) | Clean | Clean | Clean |
| PBO compatibility (120 minutes) | Good | Good | Good |
| PI compatibility (60 minutes) | Crack | Good | Good |
| compatibility (120 minutes) | Crack | Crack | Good |

Analysis 2: Corrosion Inhibitors and Etch Rate

Table 15-18 lists various inventive and comparative stripping compositions that were tested for Analysis 2 using an immersion process to measure Cu etch rate. Testing was performed using blanket Cu wafer. For the immersion process, three coupon-sized samples of semiconductor wafers were processed in beakers. Beakers were filled with 100 grams of a stripping composition and heated to the target temperature. When the stripping composition was at the target temperature, three coupons were placed in a holder in the beaker, and slight agitation was provided by a stir bar. Temperature was maintained at the process temperature in the table throughout the process. After a total processing time of 15 minutes, the coupons were removed from the beaker, rinsed with DI water and IPA, and dried with a stream of nitrogen.

The thickness of the Cu layer was measured before and after processing for each coupon using RESMAP to calculate the change in thickness and the etch rate. In Tables 15 and 16, a single corrosion inhibitor was studied by monitoring Cu etch rate. 0.5% Cysteine (formulation 31) has lowest Cu etch rate. 0.5% 8-hydroquinoline (formulation 28) and 0.5% glycerol (formulation 33) have no effect on Cu protection. 0.5% catechol (formulation 29), resorcinol (formulation 27) and 2-aminobenzotriazole (formulation 30) lowered Cu etch rate by 50% compared to formulation 27 without any corrosion inhibitor while D-sorbitol (formulation 32) and sebacic acid (formulation 16) reduced Cu etch rate to some degree. 1% Glycerol (formulation 8) lowered Cu etch rate significantly. Resorcinol lowered Cu etch rate with an increase in concentration from 0.5% to 1.5% (formulations 34, 35 and 15) and further increases of concentration does not reduce Cu etch rate significantly from 1.5% to 3% (formulations 35-38). In Table 17, the combination of NADA with other corrosion inhibitors was investigated by monitoring Cu etch rate. Combination of NADA with resorcinol, catechol and sebacic acid, respectively, showed significant reduction in Cu etch rates (formulations 40, 42 and 46). The combination of NADA with D-sorbitol and glycerol showed no effect on Cu protection (formulations 44, 45). The combination of NADA with aminobenzotriazole (formulation 43) showed increased Cu etch rate while 8-hydroquinoline (formulation 41) showed a slight reduction in Cu etch rate. Table 18 illustrates the combination of corrosion inhibitors without NADA solution reduced Cu etch rate.

TABLE 15

Corrosion Inihibitor Effect on Cu Etch Rate

| Ex. | 26 | 27 | 28 | 29 | 30 | 31 | 32 | 33 | 16 |
|---|---|---|---|---|---|---|---|---|---|
| MEA | 15 | 15 | 15 | 15 | 15 | 15 | 15 | 15 | 15 |
| DB | 85 | 84.5 | 84.5 | 84.5 | 84.5 | 84.5 | 84.5 | 84.5 | 84.5 |
| Resorcinol | — | 0.5 | — | — | — | — | — | — | — |
| 8-Hydroquinoline | — | — | 0.5 | — | — | — | — | — | — |
| Catechol | — | — | — | 0.5 | — | — | — | — | — |
| 2-Aminobenzotriazole(BTA/ABT) | — | — | — | — | 0.5 | — | — | — | — |
| Cysteine | — | — | — | — | — | 0.5 | — | — | — |
| D-Sorbitol | — | — | — | — | — | — | 0.5 | — | — |
| Glycerol | — | — | — | — | — | — | — | 0.5 | — |
| Sebacic Acid | — | — | — | — | — | — | — | — | 0.5 |
| Total | 100 | 100 | 100 | 100 | 100 | 100 | 100 | 100 | 100 |
| Temperature/° C. | 50 | 50 | 50 | 50 | 50 | 50 | 50 | 50 | 50 |
| Time/min | 15 | 15 | 15 | 15 | 15 | 15 | 15 | 15 | 15 |
| Cu E/R Å/min | 39.97 | 18.32 | 39.2 | 18.77 | 19.53 | 2.42 | 28.47 | 42.68 | 25.9 |

TABLE 16

Corrosion Inhibitor Effect on Cu Etch Rate

| Ex. | 26 | 34 | 35 | 15 | 36 | 37 | 33 | 8 |
|---|---|---|---|---|---|---|---|---|
| MEA | 15 | 15 | 15 | 15 | 15 | 15 | 15 | 15 |
| DB | 85 | 84.5 | 84 | 83.5 | 83 | 82 | 84.5 | 84 |
| Resorcinol | — | 0.5 | 1 | 1.5 | 2 | 3 | — | — |
| Glycerol | — | — | — | — | — | — | 0.5 | 1 |
| Total | 100 | 100 | 100 | 100 | 100 | 100 | 100 | 100 |
| Temperature/° C. | 50 | 50 | 50 | 50 | 50 | 50 | 50 | 50 |
| Time/min. | 15 | 15 | 15 | 15 | 15 | 15 | 15 | 15 |
| Cu E/R Å/min | 39.97 | 18.32 | 9.8 | 3.66 | 3.38 | 2.88 | 42.68 | 8.82 |

TABLE 17

Corrosion Inhibitor Effect on Cu Etch Rate

| Ex. | 26 | 39 | 40 | 41 | 42 | 43 | 44 | 45 | 46 |
|---|---|---|---|---|---|---|---|---|---|
| MEA | 15 | 15 | 15 | 15 | 15 | 15 | 15 | 15 | 15 |
| DB | 85 | 84.96 | 84.46 | 84.46 | 84.46 | 84.46 | 84.46 | 84.46 | 84.46 |
| 1N NADA | — | 0.04 | 0.04 | 0.04 | 0.04 | 0.04 | 0.04 | 0.04 | 0.04 |
| Resorcinol | — | — | 0.5 | — | — | — | — | — | — |
| 8-Hydroquinoline | — | — | — | 0.5 | — | — | — | — | — |
| Catechol | — | — | — | — | 0.5 | — | — | — | — |
| 2-Aminobenzotriazole (BTA/ABT) | — | — | — | — | — | 0.5 | — | — | — |
| D-Sorbitol | — | — | — | — | — | — | 0.5 | — | — |

TABLE 17-continued

Corrosion Inhibitor Effect on Cu Etch Rate

| Ex. | 26 | 39 | 40 | 41 | 42 | 43 | 44 | 45 | 46 |
|---|---|---|---|---|---|---|---|---|---|
| Glycerol | — | — | — | — | — | — | — | 0.5 | — |
| Sebacic Acid | — | — | — | — | — | — | — | — | 0.5 |
| Total | 100 | 100 | 100 | 100 | 100 | 100 | 100 | 100 | 100 |
| Temperature/° C. | 50 | 50 | 50 | 50 | 50 | 50 | 50 | 50 | 50 |
| Time/min. | 15 | 15 | 15 | 15 | 15 | 15 | 15 | 15 | 15 |
| Cu E/R: Å/min. | 39.97 | 22.31 | 6.77 | 14.06 | 2.04 | 35.67 | 20.89 | 18.11 | 3.1 |

TABLE 18

Strong Performing Corrosion Inhibitors

| | Ex. | | | | |
|---|---|---|---|---|---|
| | 26 | 39 | 47 | 48 | 49 |
| MEA | 15 | 15 | 15 | 15 | 15 |
| DB | 85 | 84.96 | 84 | 84 | 84 |
| 1N NADA | — | 0.04 | — | — | — |
| Resorcinol | — | — | 0.5 | — | 0.5 |
| Catechol | — | — | 0.5 | 0.5 | — |
| Sebacic Acid | — | — | — | 0.5 | 0.5 |
| Total | 100 | 100 | 100 | 100 | 100 |
| Temperature/° C. | 50 | 50 | 50 | 50 | 50 |
| Time/min. | 15 | 15 | 15 | 15 | 15 |
| Cu E/R: Å/min. | 39.97 | 22.31 | 15.27 | 14.97 | 5.11 |

SUMMARY OF RESULTS

DB is the fast stripping solvent for CR4000 removal among all solvents tested at 15% MEA loading. Alkanolamine showed better resist cleaning performance than amine in 10 minutes at 30% MEA level where CR4000 could be cleaned in 10 minutes regardless of the solvent used MMB and water showed better compatibility with PI than DB solvent.

With 15% loading of amine or alkanolamine, all formulations demonstrated good compatibility with PI after 120 minutes. In general, higher MEA concentrations produced better resist stripping but showed worse compatibility with PI.

Cysteine performed well as a single corrosion inhibitor to lower Cu etch rate.

Resorcinol lowered Cu etch rate with an increase in concentration from 0.5% to 1.5% but further increases of concentration does not reduce Cu etch rate significantly from 1.5% to 3%.

Combinations of NADA with resorcinol, catechol and sebacic acid, respectively, showed significant reduction in Cu etch rates. For example, NADA, Catechol, resorcinol and 2-aminobenzotriazole lowered Cu etch rate by 50% compared to control without any corrosion inhibitor.

Some corrosion inhibitor pairs (e.g., resorcinol and sebacic acid) exhibited Cu etch rates about 7 times lower than control without corrosion inhibitor.

Although the disclosed and claimed subject matter has been described and illustrated with a certain degree of particularity, it is understood that the disclosure has been made only by way of example, and that numerous changes in the conditions and order of steps can be resorted to by those skilled in the art without departing from the spirit and scope of the disclosed and claimed subject matter. Thus, it will be understood by those skilled in the art that various changes may be made, and equivalents may be substituted for elements thereof without departing from the scope of the disclosed and claimed subject matter. In addition, many modifications may be made to adapt a particular situation or material to the teachings of the disclosed and claimed subject matter without departing from the essential scope thereof. In addition, all numerical values identified in the detailed description shall be interpreted as though the precise and approximate values are both expressly identified.

What is claimed is:

1. A cleaning composition comprising:
   (i) about 10 wt % to about 30 wt % of one or more alkanolamines comprising monoethanolamine,
   (ii) about 50 wt % to about 90 wt % of one or more ether alcohol solvents or aromatic containing alcohol comprising diethylene glycol monobutyl ether, and
   (iii) about 0.25 wt % to about 2 wt % of a mixture of two or more corrosion inhibitors consisting of (i) a first corrosion inhibitor comprising a copper salt and (ii) a second corrosion inhibitor selected from the group consisting of sebacic acid, catechol, resorcinol, glycerol, sorbitol and 8-hydroxyquinoline,
   wherein the composition comprises less than about 0.1 wt % of water and is free of quaternary ammonium compounds and DMSO.

2. The composition of claim 1, wherein the composition comprises about 15 wt % of 1,2-alkanolamine.

3. The composition of claim 1, wherein the one or more alkanolamines consists of

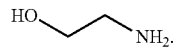

4. The composition of claim 1, wherein the one or more alkanolamines comprises one or more of, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxy)ethanol.

5. The composition of claim 1, wherein the one or more ether alcohol solvents or aromatic containing alcohol further comprises one or more of, diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, diethylene glycol diethyl ether, diethylene glycol (DEG), or dipropylene glycol, 3-methoxy-3-methyl-1-butanol (MMB), furfurylalcohol, tetrahydrofurfuryl alcohol, benzyl alcohol, benzyl ethanol and benzyl propanol.

6. The composition of claim 1, wherein the one or more ether alcohol solvents or aromatic containing alcohol further comprises one or more glycol ether.

7. The composition of claim 1, wherein the one or more ether alcohol solvents or aromatic containing alcohol further comprises one or more alcohol having an ether group.

8. The composition of claim 1, wherein the one or more ether alcohol solvents or aromatic containing alcohol further comprises one or more alkanol substituted benzene.

9. The composition of claim 1, wherein the one or more ether alcohol solvents or aromatic containing alcohol comprises about 55 wt % to about 90 wt % of the composition.

10. The composition of claim 1, wherein the mixture of two or more corrosion inhibitors comprises about 1 wt % of the composition.

11. The composition of claim 1, wherein the copper salt is one or more of copper (II) nitrate, copper (II) bromide, copper (II) chlorate, copper (II) chloride, copper (II) fluorosilicate, copper (II) formate, copper (II) selenite, copper (II) sulfate and copper(II) nitrate hemi(pentahydrate).

12. The composition of claim 1, wherein the mixture of two or more corrosion inhibitors comprises about 0.5 wt % to about 1.5 wt % of one or a combination of catechol, resorcinol and sebacic acid.

13. The composition of claim 1, wherein the mixture of two or more corrosion inhibitors comprises about 0.5 wt % to about 1.5 wt % of resorcinol.

14. The composition of claim 1, wherein the mixture of two or more corrosion inhibitors comprises a copper nitrate salt and resorcinol.

15. The composition of claim 1, wherein the mixture of two or more corrosion inhibitors comprises a copper nitrate salt.

16. The composition of claim 1, further comprising one or more of ethylene glycol, 1,2-propanediol, 1,3-propanediol, 1,2,3-propanetriol, 1,2-butanediol, 1,3-propanediol, 2,3-butanediol, 1,4-butanediol, 1,2,3-butanetriol, 1,2,4-butanetriol, 1,2-pentanediol, 1,3-pentanediol, 1,4-pentandiol, 2,3-pentanediol, 2,4-pentandiol, 3,4-pentanediol, 1,2,3-pentanetriol, 1,2,4-pentanetriol, 1,2,5-pentanetriol, 1,3,5-pentanetriol, etohexadiol, p-methane-3,8-polyhydroxyl compound, 2-methyl-2,4-pentanediol, 2,2-dimethyl-1,3-propanediol, glycerin, trimethylolpropane, xylitol, arabitol, 1,2-cyclopentanediol, 1,3-cyclopentanediol, 1,2-cyclohexanediol, 1,3-cyclohexanediol, 2,3-norbornanediol, 1,8-octanediol, 1,2-cyclohexane-dimethanol, 1,3-cyclohexanedimethanol, 1,4-cyclohexanedimethanol, 2,2,4-trimethyl-1,3-pentanediol, hydroxypivalyl hydroxypivalate, 2-methyl-1,3-propanediol, 2-butyl-2-ethyl-1,3-propanediol, 2-ethyl-2-isobutyl-1,3-propanediol, 1,6-hexanediol, 2,2,4,4-tetramethyl-1,6-hexanediol, 1,10-decanediol, 1,4-benzenedimethanol, hydrogenated bisphenol A, 1,1,1-trimethylol propane, 1,1,1-trimethylolethane, pentaerythritol, erythritol, threitol and dipentaerythritol.

17. The composition of claim 1 further comprising about 10 wt % to about 50 wt % of a secondary solvent that is one or more of a linear aliphatic alcohol, a branched chain aliphatic alcohol and an aromatic alcohol.

18. The composition of claim 1 further comprising about 10 wt % to about 50 wt % of a secondary solvent that is one or more of methanol, ethanol, propanol, isopropyl alcohol, butanol, tert-butyl alcohol, tert-amyl alcohol, 3-methyl-3-pentanol, 1-octanol, 1-decanol, 1-undecanol, 1-dodecanol, 1-tridecanol, 1-tetradecanol, 1-pentadecanol, 1-hexadecanol, 9-hexadecen-1-ol, 1-heptadecanol, 1-octadecanol, 1-nonadecanol, 1-eicosanol, 1-heneicosanol, 1-docosanol, 13-docosen-1-ol, 1-tetracosanol, 1-hexacosanol, 1-heptacosanol, 1-octacosanol, 1-triacontanol, 1-dotriacontanol, 1-tetratriacontanol, cetearyl alcohol, propylene glycol and ethylene glycol.

* * * * *